US007535023B2

(12) United States Patent
Hu

(10) Patent No.: US 7,535,023 B2
(45) Date of Patent: May 19, 2009

(54) DISPLAY DEVICES AND POWER DEVICES

(75) Inventor: Shuo-Hsiu Hu, Tainan (TW)

(73) Assignee: Au Optronics Corp., Hsinchu (TW)

( * ) Notice: Subject to any disclaimer, the term of this patent is extended or adjusted under 35 U.S.C. 154(b) by 458 days.

(21) Appl. No.: 11/337,632

(22) Filed: Jan. 23, 2006

(65) Prior Publication Data

US 2006/0158128 A1 Jul. 20, 2006

(30) Foreign Application Priority Data

Oct. 17, 2005 (TW) .............................. 94136137 A

(51) Int. Cl.
*H01L 29/04* (2006.01)

(52) U.S. Cl. .......................... 257/72; 257/207; 257/208

(58) Field of Classification Search ................... 257/72, 257/202, 203, 207, 208; 345/211, 212, 213
See application file for complete search history.

(56) References Cited

U.S. PATENT DOCUMENTS 7,129,939 B2 10/2006 Toyozawa
7,212,187 B2 * 5/2007 Park et al. ................... 345/100
7,253,565 B2 8/2007 Kang
2007/0040827 A1 2/2007 Toyozawa

FOREIGN PATENT DOCUMENTS

| | | |
|---|---|---|
| JP | 09-233016 | 5/1997 |
| KR | 20040018658 | 3/2004 |
| TW | 169441 | 7/1991 |
| TW | 583629 | 4/2004 |

OTHER PUBLICATIONS

English Language abstract of TW583629.
English Language abstract of TW169441.
English Language abstract of JP09-233016.
English Language abstract of KR2004-0018658.

* cited by examiner

*Primary Examiner*—Kevin M Picardat
(74) *Attorney, Agent, or Firm*—Thomas, Kayden, Horstemeyer & Risley

(57) ABSTRACT

A display device comprising a display panel, a first voltage supply unit, a second voltage supply unit, and a detecting unit. The first voltage supply unit supplies a first voltage to the display panel. The second voltage supply unit supplies a second voltage to the display panel according to a control signal. The detecting unit detects the first voltage. The detecting unit generates the control signal when detecting the variance in the first voltage.

18 Claims, 6 Drawing Sheets

DISPLAY DEVICES AND POWER DEVICES

BACKGROUND

The invention relates to a power device, and in particular to a power device applied in a display device.

FIG. 1 is a schematic diagram of a panel of a conventional organic light emitting display (OLED) device. A panel 1 comprises a data driver 10, a scan driver 11, and a display array 12. The data driver 10 controls a plurality of data lines $D_1$ to $D_n$, and the scan driver 11 controls a plurality of scan lines $S_1$ to $S_m$. The display array 12 is formed by the interlaced data lines $D_1$ to $D_n$ and scan lines $S_1$ to $S_m$. Each interlaced data line and scan line control a display unit of the display array 12. For example, the data line $D_1$ and the scan line $S_1$ control a display unit 100. As with any other display unit, the equivalent circuit of the display unit 100 comprises a switch transistor T10, a storage capacitor C10, a driving transistor T11, and a light-emitting diode (LED) D10.

An OLED device is a self-illuminating flat panel display. Light from the LED D10 is transformed from current I flowed itself. The brightness of the LED D10 can be determined according to the current I provided by the driving transistor T11. In the panel 1, voltage Vdd, provided to the driving transistor T11, must be adjusted due to process derivation of the driving transistor T11, thus, the brightness from all the display units of the display array 12 reaches a predetermined level. In general, the adjustment range of the voltage Vdd is 2V.

Referring to FIG. 2, an external power device provides the voltage Vdd and Vss to each display unit. The external power device provides the power consumed by all LEDs of the display array 12. In the display array 12, nodes of the voltage Vdd are connected, and nodes of the voltage Vss are connected. The nodes of the voltage Vdd and Vss are led to outer edges of the panel 1 and connected to the external power device 2 through leads.

Conventional external power devices adjust voltage Vdd and Vss or voltage Vdd only. FIG. 3*a* shows a conventional external power device adjusting voltage Vdd. An external power device 2 comprises DC/DC converters 31 and 32 and adjusting devices 33 and 34. The DC/DC converters 31 and 32 respectively provide voltage Vdd and Vss. Both adjusting devices 33 and 34 have two impedance elements R. A value of an impedance element R1 of the adjusting devices 33 is adjustable, and a value of an impedance element R2 thereof is fixed. When the DC/DC converter 31 provides the voltage Vdd to the panel 1, a feedback voltage Vf1 is acquired by dividing the voltage Vdd by the impedance elements R1 and R2. The DC/DC converter 31 determines the value of the voltage Vdd according to the feedback voltage Vf1. When the voltage Vdd requires adjustment due to the process derivation of the transistor T11, the feedback voltage Vf1 is varied by adjusting the value of the impedance elements R1. The DC/DC converters 31 thus adjust the value of the voltage Vdd according to the varied feedback voltage Vf1. Since the DC/DC converter 32 provides the fixed voltage Vss, the values of the impedance elements R3 and R4 are fixed. For a panel only requiring 10V cross-voltage, which is defined by the voltage between Vdd and Vss, the cross-voltage of the entire panel varies between 10V and 12V, resulting in a maximum consumption increment of 20% power for the panel.

FIG. 3*b* shows a conventional external power device adjusting both voltage Vdd and Vss. An external power device 3 comprises DC/DC converters 35 and 36 and adjusting devices 37 and 38. The DC/DC converters 35 and 36 respectively provide voltage Vdd and Vss. Both adjusting devices 37 and 38 have two impedance elements R. A value of an impedance element R5 of the adjusting devices 37 is adjustable, and a value of an impedance element R6 thereof is fixed. When the voltage Vdd needs to be adjusted due to process derivation of the transistor T11, the feedback voltage Vf1 is varied by adjusting the value of the impedance elements R5, and the DC/DC converters 35 thus adjusts the value of the voltage Vdd according to the varied feedback voltage Vf1. After the voltage Vdd is adjusted, the voltage Vss is adjusted to avoid the excess power consumption, so that the cross-voltage between Vdd and Vss is maintained at 10V. In the external power device 3, a value of an impedance element R7 of the adjusting devices 38 is adjustable, and a value of an impedance element R8 thereof is fixed. The DC/DC converter 36 and adjusting devices 38 perform the same operation respectively as the DC/DC converter 35 and adjusting devices 37. When the voltage Vss needs to be adjusted due to the process derivation, the feedback voltage Vf2 is varied by adjusting the value of the impedance elements R7, and the DC/DC converters 36 thus adjusts the value of the voltage Vss according to the varied feedback voltage Vf2. According to the external power device of FIG. 3*b*, when process derivation of the transistor T11 occurs, not only the voltage Vdd but also the voltage Vss is adjusted, resulting in an increased number of manufacturing processes for OLED devices.

SUMMARY

An exemplary embodiment of a display device comprises a display panel, a first voltage supply unit, a second voltage supply unit, and a detecting unit. The first voltage supply unit provides first voltage to the display panel. The second voltage supply unit provides second voltage to the display panel according to a control signal. The detecting unit detects the first voltage. The detecting unit generates the control signal upon detecting variance in the first voltage.

In some embodiments, when the first voltage increases, the second voltage increases. The variation of the first voltage is equal to the variation of the second voltage.

An exemplary embodiment of a display device comprises a display panel, a first voltage supply unit, a second voltage supply unit, and a detecting unit. The first voltage supply unit supplies a first voltage to the display panel. The second voltage supply unit supplies a second voltage to the display panel according to a control signal. The detecting unit detects the first and second voltage and calculates cross-voltage between the first and second voltage. When the cross-voltage is not equal to a reference voltage, the detecting unit generates the control signal.

DESCRIPTION OF THE DRAWINGS

The invention will become more fully understood from the detailed description given hereinbelow and the accompanying drawings, given by way of illustration only and thus not intended to be limitative of the invention.

DETAILED DESCRIPTION

Figure 1:
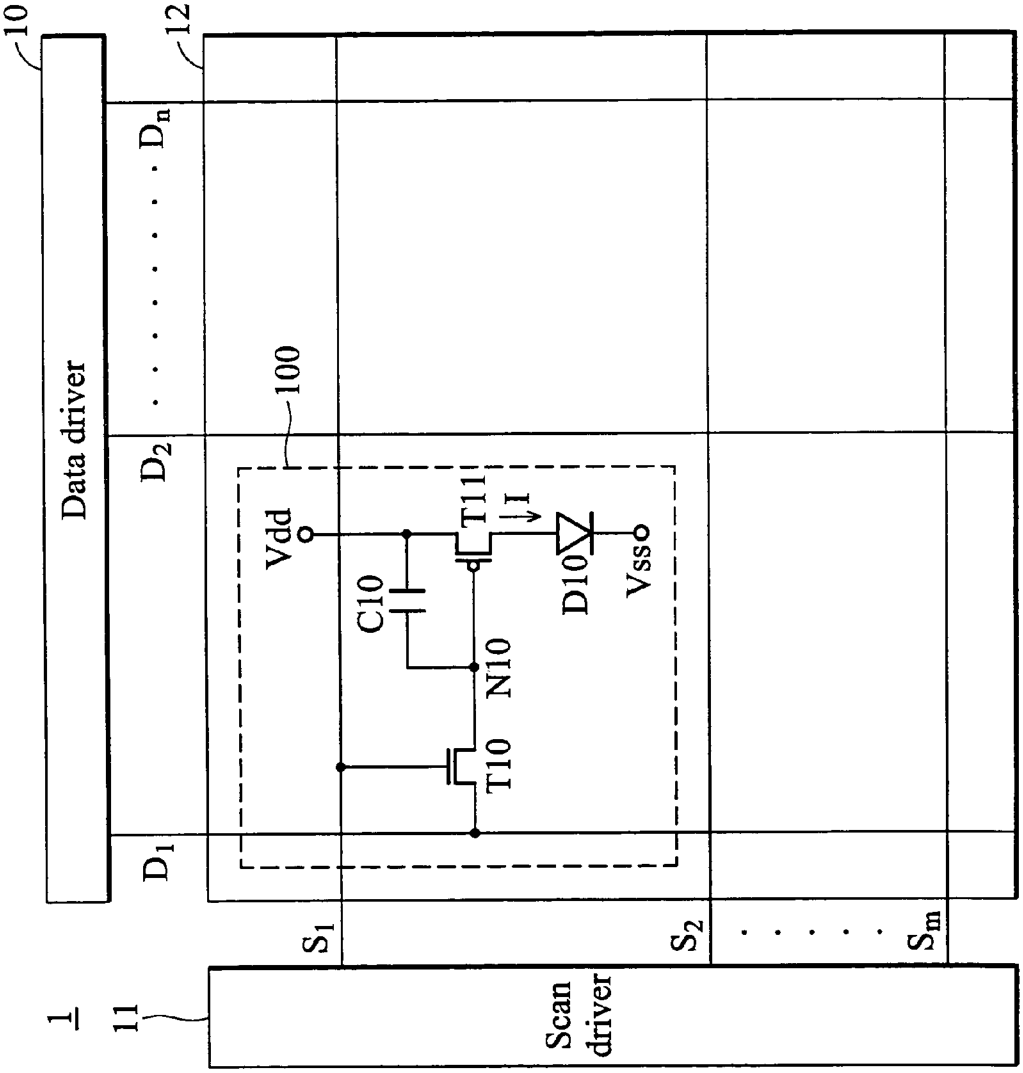
FIG. 1 (RELATED ART)
FIG. 1 shows a panel of a conventional OLED device.
Figure 2:
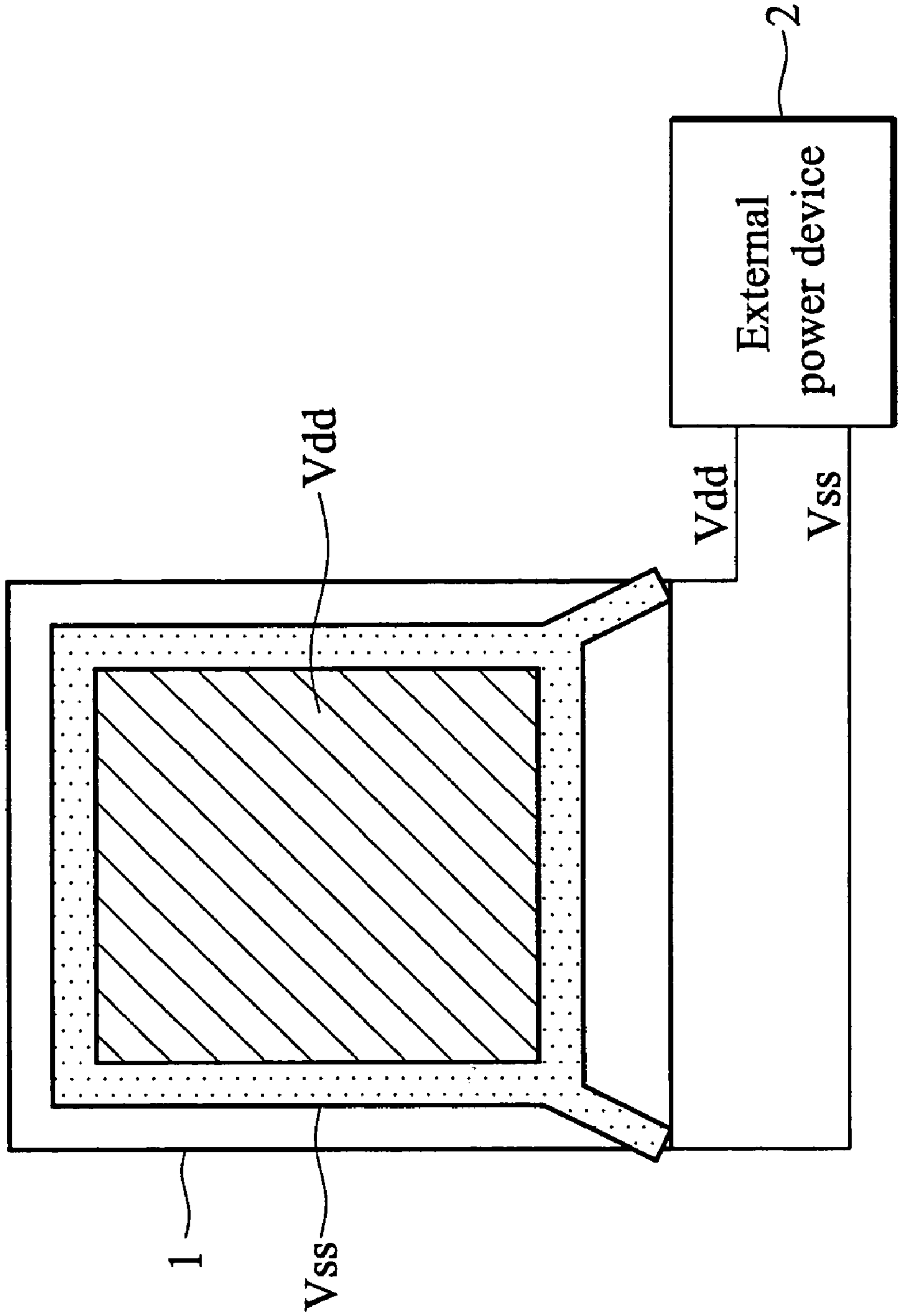
FIG. 2 (RELATED ART)
FIG. 2 shows a block diagram of a panel and an external power device of a conventional OLED device.
Figure 3A:
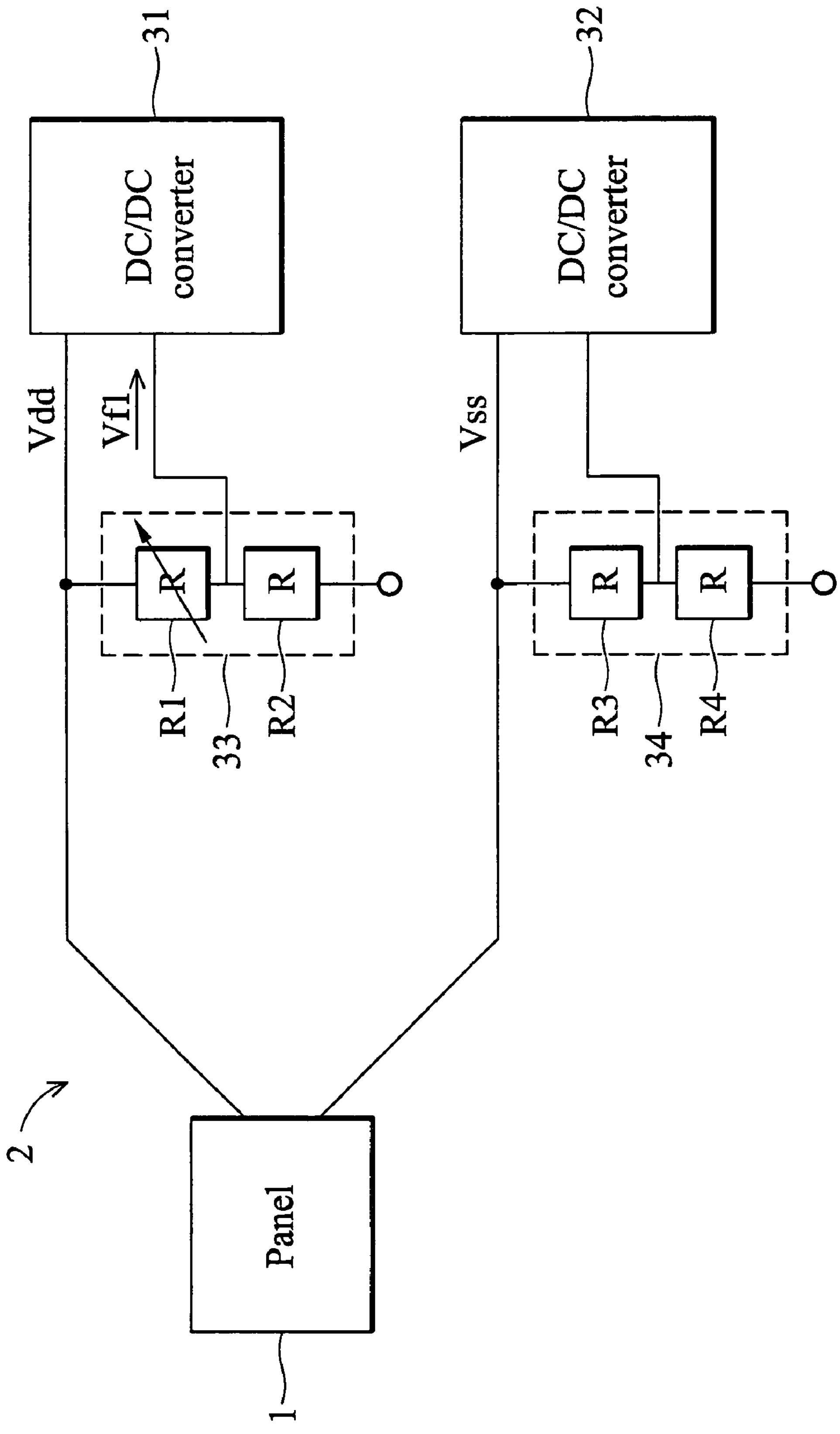
FIG. 3a (RELATED ART)
FIGS. 3*a* and 3*b* show conventional external power devices.
Figure 3B:
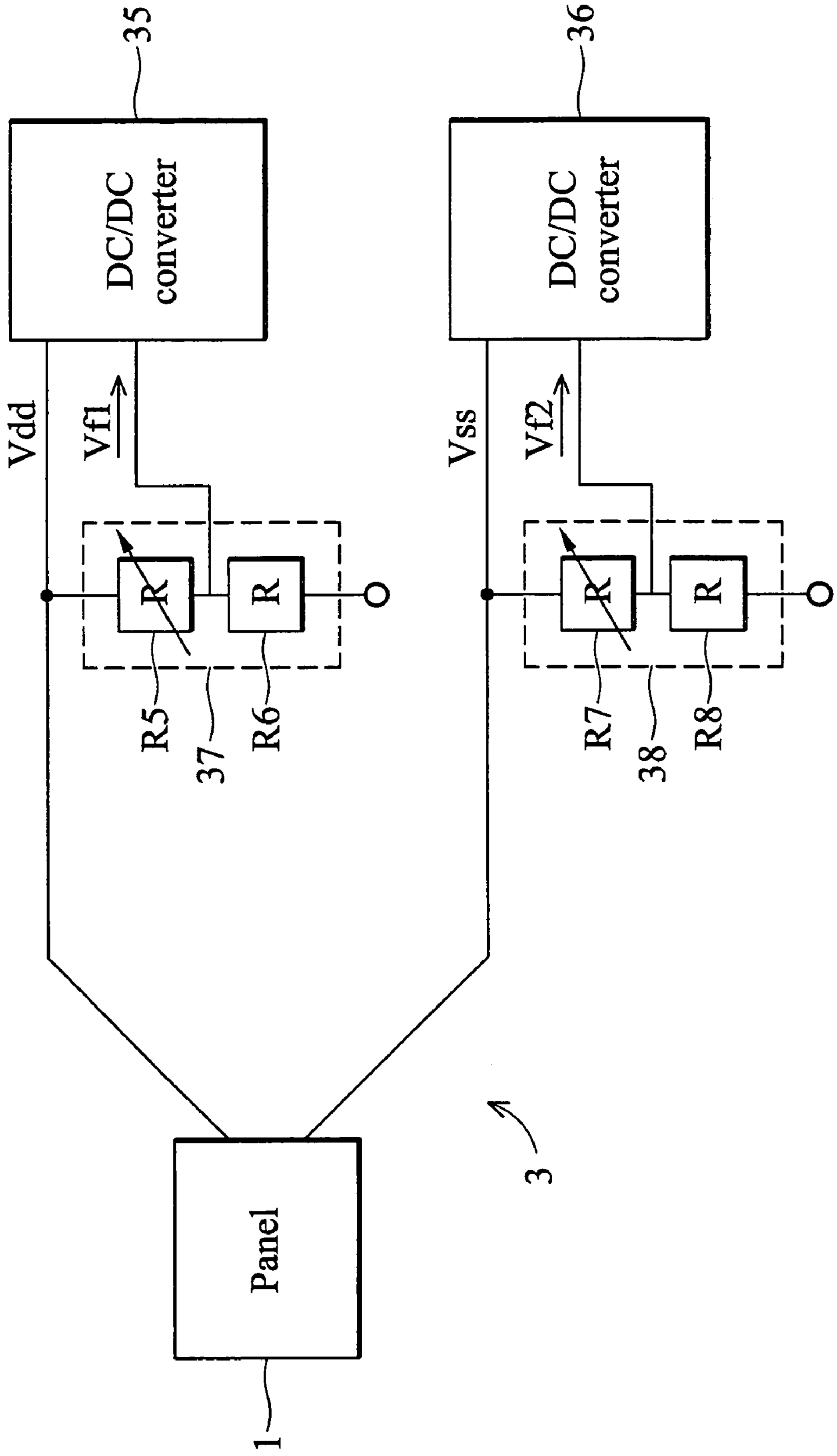
FIG. 3b (RELATED ART)
Figure 4:
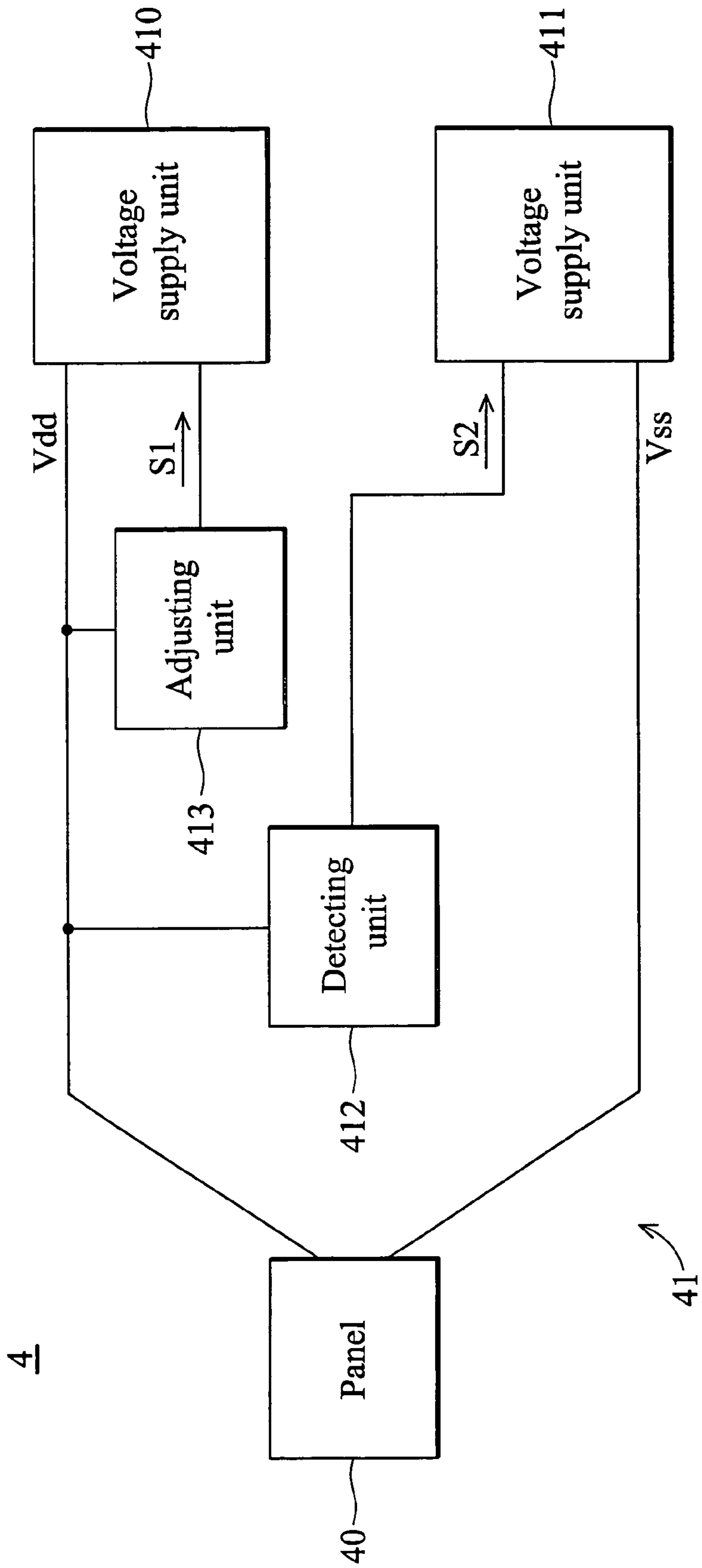
FIG. 4 shows an embodiment of a display device.

In an exemplary embodiment of a display device shown in FIG. 4, a display device 4 comprises a display panel 40 and a power device 41. In this embodiment, the display panel 40 comprises the same display array as the panel 1 in FIG. 1. Each display unit of the display array requires voltage Vdd and Vss, and the cross-voltage between the voltage Vdd and Vss is 10V. The power device 41 comprises voltage supply units 410 and 411 respectively providing the voltage Vdd and Vss to the display panel 40. In this embodiment, the voltage supply units 410 and 411 can be DC/DC converter, the value of the voltage Vdd is positive, and the value of the voltage Vss is negative. The power device 41 further comprises a detecting unit 412 and an adjusting unit 413. The adjusting unit 413 detects the voltage Vdd and outputs a corresponding adjusting signal S1 to the voltage supply unit 410, so that the voltage supply unit 410 continuously provides the same voltage Vdd according to the adjusting signal S1. When the voltage Vdd needs to be adjusted due to the process derivation of the driving transistor, the adjusting unit 413 varies the adjusting signal S1. The voltage supply unit 410 adjusts the value of the voltage Vdd according to the varied feedback voltage S1. In other words, when the adjusting signal S1 is varied, the voltage supply unit 410 varies the value of the voltage Vdd.

The detecting unit 412 also detects the voltage Vdd. When detecting the variance in the voltage Vdd, the detecting unit 412 generates a corresponding control signal S2. The voltage supply unit 411 determines the value of the voltage Vss according to the control signal S2, so that the cross-voltage between the voltage Vdd and Vss maintains at 10V. The voltage Vss increases as the voltage Vdd increases, and the voltage Vss decreases as the voltage Vdd decreases. In other words, the variation of the voltage Vdd is equal to that of the voltage Vss.

According to the embodiment of FIG. 4, when the value of the voltage vDD is varied, the detecting unit 412 simultaneously provides the control signal S2 to the voltage supply unit 411 to vary the value of the voltage Vss automatically. The cross-voltage between the voltage Vdd and Vdd does not vary when the voltage is adjusted, avoiding the increment in consumed power.

Figure 5:
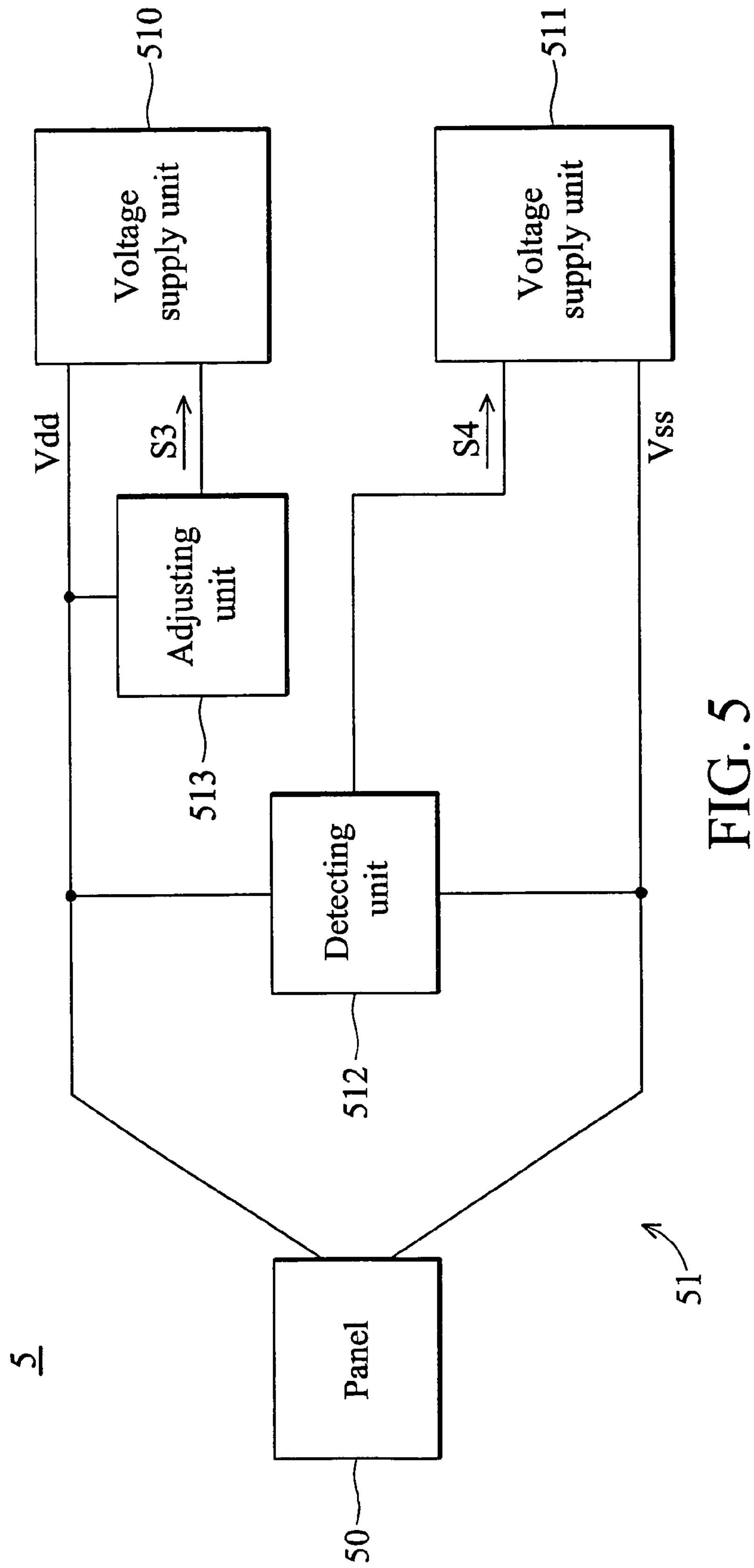
FIG. 5 shows an embodiment of a display device.

In an exemplary embodiment of a display device in FIG. 5, a display device 5 comprises a display panel 50 and a power device 51. In this embodiment, the display panel 50 comprises the same display array as the panel 1 in FIG. 1. Each display unit of the display array requires voltage Vdd and Vss, and the cross-voltage between the voltage Vdd and Vss is 10V. The power device 51 comprises voltage supply units 510 and 511 respectively providing the voltage Vdd and Vss to the display panel 50. In this embodiment, the voltage supply units 510 and 511 can be DC/DC converters, the value of the voltage Vdd is positive, and the value of the voltage Vss is negative. The power device 51 further comprises a detecting unit 512 and an adjusting unit 513. The adjusting unit 513 detects the voltage Vdd and outputs a corresponding adjusting signal S3 to the voltage supply unit 510, so that the voltage supply unit 510 continuously provides the same voltage Vdd according to the adjusting signal S3. When the voltage Vdd requires adjustment due to process derivation of the driving transistor, the adjusting unit 513 varies the adjusting signal S3. The voltage supply unit 510 adjusts the value of the voltage Vdd according to the varied feedback voltage S3. In other words, when the adjusting signal S3 is varied, the voltage supply unit 510 varies the value of the voltage Vdd.

The detecting unit 512 detects not only the voltage Vdd but also the voltage Vss. The detecting unit 512 has a reference cross-voltage, and in this embodiment, the reference cross-voltage is equal to 10V. The detecting unit 512 detects the voltage Vdd and Vss and calculates the cross-voltage between voltage Vdd and Vss. When the voltage Vdd is adjusted, the calculated cross-voltage is not equal to 10V, and the detecting unit 512 generates a corresponding control signal S4. The voltage supply unit 511 determines the value of the voltage Vss according to the control signal S4, so that the cross-voltage between the voltage Vdd and Vss maintains at 10V.

According to the embodiment of FIG. 5, when the cross-voltage between the voltage Vdd and Vdd is varied due to the adjusted voltage Vdd, the detecting unit 512 simultaneously provides the control signal S4 to the voltage supply unit 511 to automatically vary the value of the voltage Vss. The cross-voltage between the voltage Vdd and Vdd does not vary when the voltage Vdd is adjusted, avoiding the increment in consumed power.

While the invention has been described in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A display device, comprising:

a display panel;

a first voltage supply unit for providing a first voltage to the display panel;

a detecting unit for detecting the first voltage and generating a control signal in response to detection of a variance in the first voltage; and a second voltage supply unit for providing a second voltage to the display panel according to the control signal.

2. The display device as claimed in claim 1, wherein the second voltage increases as the first voltage increases.

3. The display device as claimed in claim 2, wherein the variation of the first voltage is substantially equal to the variation of the second voltage.

4. The display device as claimed in claim 1, further comprising an adjusting unit for providing an adjusting signal to adjust the first voltage.

5. The display device as claimed in claim 1, further comprising a display array having a plurality of display units, wherein the first and second voltage supply units, respectively, provide the first and second voltages to each display unit.

6. The display device as claimed in claim 1, wherein at least one of the first and second voltage supply units is a DC/DC converter.

7. A display device comprising:

a display panel;

a first voltage supply unit for providing a first voltage to the display panel;

a detecting unit for detecting the first and second voltage and generating a control signal in response to detection of cross-voltage between the first and second voltage substantially not equal to a reference voltage; and a second voltage supply unit providing second voltage to the display panel according to the control signal.

8. The display device as claimed in claim 7, further comprising an adjusting unit for providing an adjusting signal to adjust the first voltage.

9. The display device as claimed in claim 7, further comprising a display array having a plurality of display units, wherein the first and second voltage supply units, respectively, provide the first and second voltage to each display unit.

10. The display device as claimed in claim 7, wherein at least one of the first and second voltage supply units is a DC/DC converter.

11. A power device comprising:

a first voltage supply unit for providing a first voltage;

a detecting unit for detecting the first voltage and generating a control signal in response to detection of a variance in the first voltage; and a second voltage supply unit for providing a second voltage according to the control signal.

12. The power device as claimed in claim 11, wherein the second voltage increases as the first voltage increases.

13. The power device as claimed in claim 12, wherein the variation of the first voltage is substantially equal to the variation of the second voltage.

14. The power device as claimed in claim 11, further comprising an adjusting unit for providing an adjusting signal to adjust the first voltage.

15. The power device as claimed in claim 11, wherein at least one of the first and second voltage supply units is a DC/DC converter.

16. A power device comprising:

a first voltage supply unit for providing a first voltage;

a detecting unit for detecting the first and second voltage and generating a control signal in response to detection of cross-voltage between the first and second voltage substantially not equal to a reference voltage; and a second voltage supply unit for providing a second voltage according to the control signal.

17. The power device as claimed in claim 16, further comprising an adjusting unit for providing an adjusting signal to adjust the first voltage.

18. The power device as claimed in claim 16, wherein at least one of the first and second voltage supply units is a DC/DC converter.

* * * * *